United States Patent
Takeda et al.

(10) Patent No.: US 10,036,840 B2
(45) Date of Patent: Jul. 31, 2018

(54) CIRCULAR POLARIZING PLATE AND BENDABLE DISPLAY DEVICE

(71) Applicant: NITTO DENKO CORPORATION, Ibaraki-shi, Osaka (JP)

(72) Inventors: Kentarou Takeda, Ibaraki (JP); Hironori Yaginuma, Ibaraki (JP); Hiroshi Sumimura, Ibaraki (JP); Nao Murakami, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 14/766,046

(22) PCT Filed: Jan. 29, 2014

(86) PCT No.: PCT/JP2014/051874
§ 371 (c)(1),
(2) Date: Aug. 5, 2015

(87) PCT Pub. No.: WO2014/123038
PCT Pub. Date: Aug. 14, 2014

(65) Prior Publication Data
US 2015/0369981 A1 Dec. 24, 2015

(30) Foreign Application Priority Data

Feb. 7, 2013 (JP) .................................. 2013-021904
Jan. 21, 2014 (JP) .................................. 2014-008568

(51) Int. Cl.
*G02B 5/30* (2006.01)
*G02B 27/28* (2006.01)
(Continued)

(52) U.S. Cl.
CPC ........... *G02B 5/305* (2013.01); *G02B 5/3025* (2013.01); *G02B 5/3083* (2013.01);
(Continued)

(58) Field of Classification Search
CPC .. G02B 5/3025; G02B 5/3033; G02B 5/3041; G02B 5/305; G02B 5/3058;
(Continued)

(56) References Cited

U.S. PATENT DOCUMENTS 6,762,266 B2   7/2004   Minakuchi et al.
6,812,983 B2   11/2004   Arakawa
(Continued)

FOREIGN PATENT DOCUMENTS

CN    1385718 A    12/2002
CN    1920598 A    2/2007
(Continued)

OTHER PUBLICATIONS

Office Action dated Jan. 8, 2016, issued in counterpart Taiwanese Application No. 103103957, with English translation (8 pages).
(Continued)

*Primary Examiner* — Stephone B Allen
*Assistant Examiner* — Adam W Booher
(74) *Attorney, Agent, or Firm* — Westerman, Hattori, Daniels & Adrian, LLP

(57) ABSTRACT

There is provided a circularly polarizing plate capable of realizing a bendable display apparatus in which an excellent reflection hue is obtained and a color change due to bending is suppressed. A circularly polarizing plate according to the present invention is used in a bendable display apparatus. The circularly polarizing plate includes: a polarizer; and a retardation film arranged on one side of the polarizer. In-plane retardations of the retardation film satisfy a relationship of Re(450)<Re(550)<Re(650), and a slow axis direction of the retardation film is adjusted so as to form an angle of from 20° to 70° with respect to a bending direction of the display apparatus.

7 Claims, 4 Drawing Sheets

(51) Int. Cl.
    *H01L 51/52*     (2006.01)
    *G02F 1/1335*     (2006.01)
    *G02F 1/13363*     (2006.01)

(52) U.S. Cl.
    CPC .............. *G02B 27/288* (2013.01); *G02F 2001/133541* (2013.01); *G02F 2001/133637* (2013.01); *H01L 51/5281* (2013.01); *H01L 2251/5338* (2013.01)

(58) Field of Classification Search
    CPC .... G02B 5/3083; G02B 27/28; G02B 27/286; G02B 27/288; G02F 1/133528–1/133536; G02F 1/13363; G02F 2001/133531–2001/133548; G02F 2001/133637; G02F 2001/133638; H01L 51/5281; H01L 51/5293; H01L 2251/50; H01L 2251/53; H01L 2251/5338
    See application file for complete search history.

(56) References Cited

U.S. PATENT DOCUMENTS

| | | |
|---|---|---|
| 7,588,807 B2 | 9/2009 | Hayashi et al. |
| 7,625,612 B2 | 12/2009 | Omori et al. |
| 7,722,935 B2 | 5/2010 | Umemoto et al. |
| 8,134,987 B2 | 3/2012 | Verma et al. |
| 8,212,970 B2 | 7/2012 | Nagata |
| 8,314,987 B2 | 11/2012 | Goto et al. |
| 8,320,042 B2 | 11/2012 | Goto et al. |
| 8,379,169 B2 | 2/2013 | Kitagawa et al. |
| 8,411,360 B2 | 4/2013 | Kitagawa et al. |
| 8,520,169 B2 | 8/2013 | Kitagawa et al. |
| 8,520,171 B2 | 8/2013 | Kitagawa et al. |
| 8,687,275 B2 | 4/2014 | Coleman et al. |
| 8,709,567 B2 | 4/2014 | Kitagawa et al. |
| 8,721,816 B2 | 5/2014 | Kitagawa et al. |
| 8,771,454 B2 | 7/2014 | Goto et al. |
| 8,852,374 B2 | 10/2014 | Goto et al. |
| 8,859,648 B2 | 10/2014 | Moriyama et al. |
| 9,023,168 B2 | 5/2015 | Kitagawa et al. |
| 9,457,523 B2 | 10/2016 | Coleman et al. |
| 2002/0005925 A1* | 1/2002 | Arakawa .............. G02B 5/3083 349/117 |
| 2002/0169267 A1 | 11/2002 | Minakuchi et al. |
| 2003/0006697 A1* | 1/2003 | Weaver .............. H01L 27/3246 313/503 |
| 2003/0151813 A1 | 8/2003 | Nishida et al. |
| 2006/0062934 A1 | 3/2006 | Hayashi et al. |
| 2006/0177607 A1 | 8/2006 | Ohmori et al. |
| 2007/0056682 A1 | 3/2007 | Yamada et al. |
| 2007/0243340 A1 | 10/2007 | Umemoto et al. |
| 2009/0096965 A1 | 4/2009 | Nagata |
| 2009/0097117 A1 | 4/2009 | Coleman |
| 2009/0161045 A1* | 6/2009 | Kawamoto .......... G02B 5/3033 349/98 |
| 2009/0207490 A1 | 8/2009 | Moriyama et al. |
| 2012/0055607 A1 | 3/2012 | Kitagawa et al. |
| 2012/0055608 A1 | 3/2012 | Kitagawa et al. |
| 2012/0055621 A1 | 3/2012 | Goto et al. |
| 2012/0055622 A1 | 3/2012 | Kitagawa et al. |
| 2012/0055623 A1 | 3/2012 | Kitagawa et al. |
| 2012/0056211 A1 | 3/2012 | Kitagawa et al. |
| 2012/0056340 A1 | 3/2012 | Kitagawa et al. |
| 2012/0057104 A1 | 3/2012 | Kitagawa et al. |
| 2012/0057107 A1 | 3/2012 | Kitagawa et al. |
| 2012/0057231 A1 | 3/2012 | Goto et al. |
| 2012/0057232 A1 | 3/2012 | Goto et al. |
| 2012/0058291 A1 | 3/2012 | Kitagawa et al. |
| 2012/0058321 A1 | 3/2012 | Goto et al. |
| 2012/0086907 A1 | 4/2012 | Coleman et al. |
| 2013/0032830 A1 | 2/2013 | Lee et al. |
| 2013/0100529 A1 | 4/2013 | Kitagawa et al. |
| 2013/0114136 A1 | 5/2013 | Saito et al. |
| 2013/0114139 A1 | 5/2013 | Kitagawa et al. |
| 2013/0249378 A1 | 9/2013 | Murakami et al. |
| 2013/0271833 A1 | 10/2013 | Hatano |
| 2014/0044870 A1 | 2/2014 | Asanoi et al. |
| 2014/0186568 A1 | 7/2014 | Kitagawa et al. |
| 2014/0373997 A1 | 12/2014 | Coleman et al. |

FOREIGN PATENT DOCUMENTS

| | | |
|---|---|---|
| CN | 1976954 A | 6/2007 |
| CN | 101203780 A | 6/2008 |
| CN | 102916034 A | 2/2013 |
| JP | 2002-040258 A | 2/2002 |
| JP | 2003-207640 A | 7/2003 |
| JP | 2004144943 A | 5/2004 |
| JP | 2004-226842 A | 8/2004 |
| JP | 2006-220726 A | 8/2006 |
| JP | 2006-225626 A | 8/2006 |
| JP | 3815790 B1 | 8/2006 |
| JP | 2007-79201 A | 3/2007 |
| JP | 2009-92998 A | 4/2009 |
| JP | 4283551 B2 | 6/2009 |
| JP | 2010-139548 A | 6/2010 |
| JP | 2011-501821 A | 1/2011 |
| JP | 2012-113275 A | 6/2012 |
| JP | 2012-134117 A | 7/2012 |
| JP | 2012226231 A | 11/2012 |
| KR | 10-2011-0122345 A | 11/2011 |
| TW | 201219930 A1 | 5/2012 |
| TW | 201241074 A1 | 10/2012 |
| TW | 201243403 A1 | 11/2012 |
| TW | 201300822 A1 | 1/2013 |
| WO | 2009/049265 A1 | 4/2009 |
| WO | 2011/091314 A1 | 7/2011 |

OTHER PUBLICATIONS

International Search Report dated Mar. 4, 2014, issued in counterpart Application No. PCT/JP2014/051874 (2 pages).
Office Action dated Sep. 22, 2016, issued in counterpart Korean patent application No. 10-2015-7021249 (w/ English translation; 15 pages).
Office Action dated Sep. 19, 2016, issued in counterpart Chinese patent application No. 201480007731.7 (w/English translation; 26 pages).
Office Action dated Apr. 18, 2017, issued in counterpart Chinese patent application No. 201480007731.7 (w/ English translation; 23 pages).
Office Action dated Oct. 4, 2017, issued in counterpart Japanese patent application No. 2014-008568 (w/ English translation; 9 pages).
Office Action dated May 9, 2018, issued in counterpart Japanese patent application No. 2014-008568 (w/ English translation; 10 pages).

\* cited by examiner

CIRCULAR POLARIZING PLATE AND BENDABLE DISPLAY DEVICE

TECHNICAL FIELD

The present invention relates to a circularly polarizing plate to be used mainly for an antireflection purpose and to a bendable display apparatus in which such circularly polarizing plate is used.

BACKGROUND ART

The number of opportunities for the use of a display apparatus, for example, a smart device typified by a smart phone, digital signage, or a window display, under strong ambient light has been increasing in recent years. In association with the increase, there has been occurring a problem such as: the reflection of the ambient light by the display apparatus itself or a reflector to be used in the display apparatus such as a touch panel portion, a glass substrate, or a metal wiring; or the reflection of a background on the display apparatus or the reflector. In particular, an organic electroluminescence (EL) panel that has started to be put into practical use in recent years is liable to cause a problem such as the reflection of the ambient light or the reflection of the background because the panel has a metal layer having high reflectivity. In view of the foregoing, it has been known that such problem is prevented by providing, as an antireflection film, a circularly polarizing plate including a retardation film (typically a λ/4 plate) on a viewer side.

Incidentally, in recent years, there has been an increasing demand for an organic EL panel that is flexible and bendable. Further, it has been demanded that the organic EL panel be not merely flexible and bendable, but be enabled to be bent with an extremely small radius of curvature. However, when the organic EL panel is bent with an extremely small radius of curvature, the retardation film of the circularly polarizing plate is subjected to a large force (partly a tensile force and partly a compressive force), resulting in a change in retardation at a portion subjected to the force. As a result, an antireflection function of the circularly polarizing plate at a bent portion is reduced, resulting in a change in color only at the bent portion, which has been recognized as a significant problem. Particularly in the case of a circularly polarizing plate including a retardation film having a reverse wavelength dispersion characteristic, although an excellent reflection characteristic is obtained, the problem of the color change due to bending is prominent.

CITATION LIST

Patent Literature

[PTL 1] JP 2010-139548 A
[PTL 2] JP 2003-207640 A
[PTL 3] JP 2004-226842 A
[PTL 4] JP 3815790 B2

SUMMARY OF INVENTION

Technical Problem

The present invention has been made in order to solve the problems as described above, and an object of the present invention is to provide a circularly polarizing plate capable of realizing a bendable display apparatus in which an excellent reflection hue is obtained and a color change due to bending is suppressed.

Solution to Problem

A circularly polarizing plate according to the present invention is used in a bendable display apparatus. The circularly polarizing plate includes: a polarizer; and a retardation film arranged on one side of the polarizer. In-plane retardations of the retardation film satisfy a relationship of $Re(450)<Re(550)<Re(650)$, and a slow axis direction of the retardation film is adjusted so as to form an angle of from 20° to 70° with respect to a bending direction of the display apparatus.

In one embodiment of the present invention, at least part of the display apparatus is bent with a radius of curvature of 10 mm or less.

In one embodiment of the present invention, the display apparatus is an organic electroluminescence display apparatus.

In one embodiment of the present invention, an absolute value of an photoelastic coefficient of the retardation film is $2\times10^{-12}$ $(m^2/N)$ or more.

In one embodiment of the present invention, the circularly polarizing plate further includes another retardation film arranged on another side of the polarizer.

According to another aspect of the present invention, there is provided a bendable display apparatus. The apparatus includes the circularly polarizing plate as described above.

Advantageous Effects of Invention

According to the present invention, in the circularly polarizing plate to be used in a bendable display apparatus, the retardation film showing reverse dispersion-type wavelength dependence (reverse wavelength dispersion characteristic) is used as the retardation film, and the slow axis direction of the retardation film is adjusted so as to be a predetermined direction with respect to the bending direction of the display apparatus. Thus, it is possible to provide the circularly polarizing plate capable of realizing a bendable display apparatus in which an excellent reflection hue is obtained and a color change due to bending is suppressed.

DESCRIPTION OF EMBODIMENTS

Now, preferred embodiments of the present invention are described. However, the present invention is not limited to these embodiments.

(Definitions of Terms and Symbols)

The definitions of terms and symbols used herein are as follows.

(1) Refractive Indices (nx, ny, and nz)

A symbol "nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.

(2) In-Plane Retardation (Re)

The term "Re(λ)" refers to the in-plane retardation of a film measured at 23° C. with light having a wavelength of λ nm. For example, the term "Re(450)" refers to the in-plane retardation of the film measured at 23° C. with light having a wavelength of 450 nm. The Re(λ) is determined from the equation "Re=(nx−ny)×d" when the thickness of the film is represented by d (nm).

(3) Thickness Direction Retardation (Rth)

The term "Rth (λ)" refers to the thickness direction retardation of the film measured at 23° C. with light having a wavelength of λ nm. For example, the term "Rth(450)" refers to the thickness direction retardation of the film measured at 23° C. with light having a wavelength of 450 nm. The Rth (λ) is determined from the equation "Rth=(nx−nz)×d" when the thickness of the film is represented by d (nm).

(4) Nz Coefficient

An Nz coefficient is determined from the equation "Nz=Rth/Re".

A. Entire Construction of Circularly Polarizing Plate

Figure 1A:
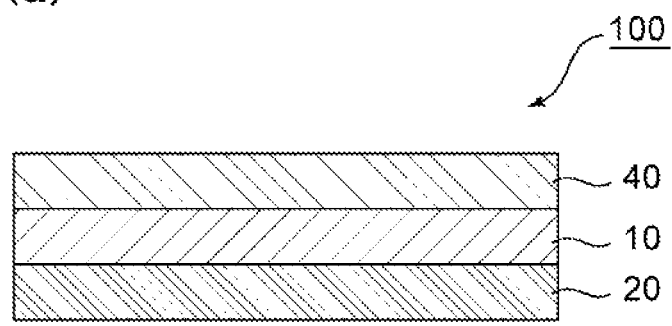
FIG. 1(a) is a schematic sectional view of a circularly polarizing plate according to one embodiment of the present invention.

FIG. 1(a) is a schematic sectional view of a circularly polarizing plate according to one embodiment of the present invention. A circularly polarizing plate 100 according to this embodiment includes a polarizer 10 and a retardation film 20 arranged on one side of the polarizer 10. As required, the circularly polarizing plate 100 may include a protective film 40 (hereinafter sometimes referred to as "outer protective film") on another side of the polarizer 10. Further, as required, another protective film (hereinafter sometimes referred to as "inner protective film": not shown) may be arranged between the polarizer 10 and the retardation film 20.

Figure 1B:
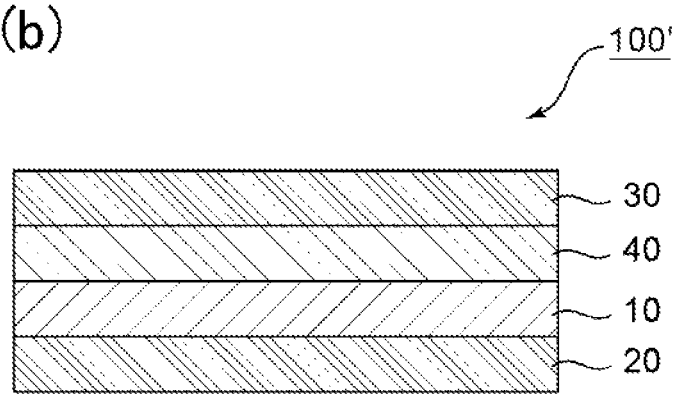
FIG. 1(b) is a schematic sectional view of a circularly polarizing plate according to another embodiment of the present invention.
Figure 2A:
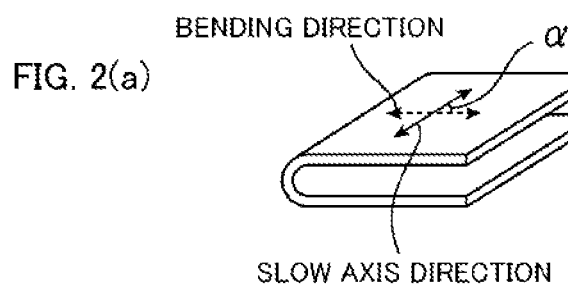
FIG. 2(a) to FIG. 2(d) are each a schematic view for illustrating a bending mode of a display apparatus of the present invention.
Figure 2B:
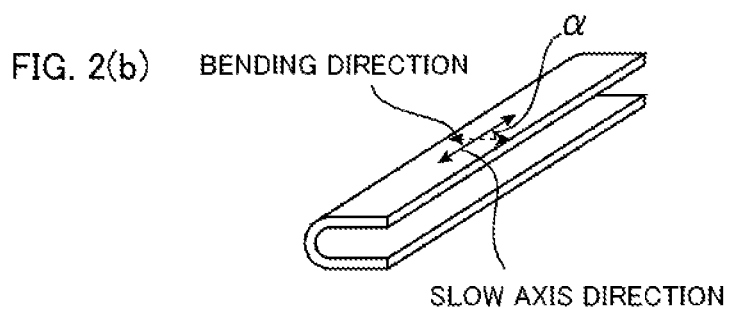
Figure 2C:
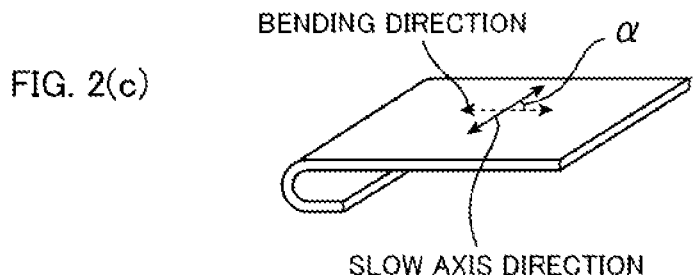
Figure 2D:
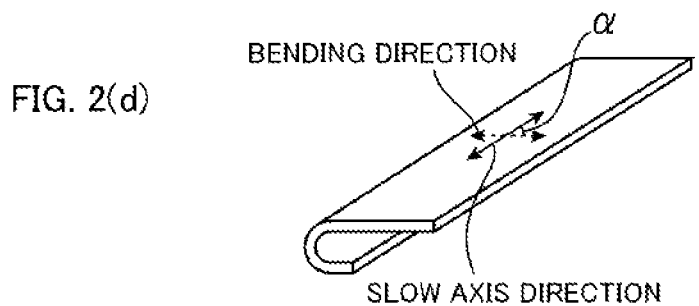

FIG. 1(b) is a schematic sectional view of a circularly polarizing plate according to another embodiment of the present invention. A circularly polarizing plate 100' according to this embodiment includes the polarizer 10, the retardation film 20 arranged on one side of the polarizer 10, and a retardation film 30 arranged on another side of the polarizer 10. In the illustrated example, there is illustrated a mode in which the circularly polarizing plate 100' includes the outer protective film 40. When the circularly polarizing plate 100' includes the outer protective film 40, the retardation film 30 may be arranged on the outer side (viewer side) of the outer protective film 40. The outer protective film 40 may be omitted. In this case, the retardation film 30 may function as an outer protective film. It should be noted that herein, for convenience, the retardation film 20 is sometimes referred to as "first retardation film" and the retardation film 30 is sometimes referred to as "second retardation film".

The circularly polarizing plate of the present invention is used in a bendable display apparatus. Specific examples of the bendable display apparatus include an organic EL display apparatus, a liquid crystal display apparatus utilizing circularly polarized light (typically a liquid crystal display apparatus of a VA mode), and a MEMS display. A bendable display apparatus in which the circularly polarizing plate of the present invention is particularly suitably used is an organic EL display apparatus. This is because, as described below, the organic EL display apparatus can be bent with an extremely small radius of curvature, and an extremely excellent reflection hue can be obtained in the organic EL display apparatus through the use of the circularly polarizing plate of the present invention. At least part of the display apparatus is bent with a radius of curvature of preferably 10 mm or less, more preferably 8 mm or less. It is one of the achievements of the present invention that a color change due to bending is suppressed while the excellent reflection hue as described above is maintained in the display apparatus in the state of being bent with such extremely small radius of curvature. More specifically, the display apparatus is bent at any appropriate portion. For example, the display apparatus may be bent at a central portion like a folding display apparatus (e.g., FIG. 2(a) and FIG. 2(b)), or may be bent at an end portion from the viewpoint of securing a design property and a display screen as much as possible (e.g., FIG. 2 (c) and FIG. 2 (d)). Further, as illustrated in FIG. 2(a) to FIG. 2(d), the display apparatus may be bent along its longitudinal direction, or may be bent along its transverse direction. Needless to say, only a certain portion of the display apparatus needs to be bent (e.g., some or all of the four corners are bent in an oblique direction) depending on applications.

The first retardation film 20 shows a reverse wavelength dispersion characteristic. Specifically, its in-plane retardations satisfy a relationship of Re(450)<Re(550)<Re(650). When such relationship is satisfied, an excellent reflection hue can be achieved in the front direction of an organic EL panel. Further, the first retardation film 20 typically has a slow axis with its refractive index characteristics showing a relationship of nx>ny. As illustrated in FIG. 2(a) to FIG. 2(d), the slow axis direction of the first retardation film 20 is adjusted so as to form an angle α with respect to a bending direction of a display apparatus. The angle α is from 20° to 70°, preferably from 30° to 60°, more preferably from 40° to 50°, particularly preferably around 45°. When the slow axis direction of the first retardation film is adjusted so that the angle α may fall within such range, a color change due to bending can be suppressed. In some cases, the second retardation film 30 is arranged for the purpose of preventing a reduction in viewability when the display apparatus is viewed with polarized sunglasses. In those cases, the second retardation film 30 may, but does not need to, show a reverse wavelength dispersion characteristic. In addition, when reference is made to an angle in this description, the angle comprehends angles in both a clockwise direction and a counterclockwise direction unless otherwise stated.

In one embodiment, the circularly polarizing plate of the present invention has an elongate shape, and hence the polarizer 10 and the first retardation film 20 (and the second retardation film 30, if present) each also have an elongate shape. The circularly polarizing plate having an elongate shape may be, for example, rolled into a roll shape to be stored and/or transported. In this embodiment, the absorption axis of the polarizer typically corresponds to an elongate direction. Therefore, an angle θ formed between the slow axis of the first retardation film 20 and the elongate direction satisfies a relationship of preferably 35°≤θ≤55°, more preferably 38°≤θ≤52°, still more preferably 39°≤θ≤51°. In another embodiment, the circularly polarizing plate of the present invention has a single plate shape, and in this case, the absorption axis of the polarizer typically forms the angle θ with respect to the elongate direction, and the slow axis of the first retardation film 20 is typically perpendicular or parallel to the elongate direction. Also in this embodiment, the preferred range of the angle θ is the same as that described above.

The total thickness of the circularly polarizing plate of the present invention, which varies depending on its construction, is typically approximately from 40 µm to 300 µm. Hereinafter, each constituent layer of the circularly polarizing plate of the present invention is described.

A-1. Polarizer

Any appropriate polarizer may be adopted as the polarizer. Specific examples thereof include: a product obtained by subjecting a hydrophilic polymer film such as a polyvinyl alcohol-based film, a partially formalized polyvinyl alcohol-based film, or an ethylene-vinyl acetate copolymer-based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The thickness of the polarizer is typically from about 1 µm to 80 µm.

The polarizer 10 and the first retardation film 20 are laminated so that the absorption axis of the polarizer 10 and the slow axis of the first retardation film 20 may form a predetermined angle. As described above, the angle θ formed between the absorption axis of the polarizer 10 and the slow axis of the first retardation film 20 satisfies a relationship of preferably $35° \leq θ \leq 55°$, more preferably $38° \leq θ \leq 52°$, still more preferably $39° \leq θ \leq 51°$.

A-2. First Retardation Film

As described above, the refractive index characteristics of the first retardation film 20 show a relationship of nx>ny. The in-plane retardation Re(550) of the retardation film is preferably from 100 nm to 180 nm, more preferably from 135 nm to 155 nm.

As described above, the first retardation film shows the so-called reverse wavelength dispersion dependency. Specifically, its in-plane retardations satisfy a relationship of Re(450)<Re(550)<Re(650). A ratio Re(450)/Re(550) is preferably 0.8 or more and less than 1.0, more preferably from 0.8 to 0.95. A ratio Re(550)/Re(650) is preferably 0.8 or more and less than 1.0, more preferably from 0.8 to 0.97.

The first retardation film 20 shows any appropriate refractive index ellipsoid as long as the film has the relationship of nx>ny. The refractive index ellipsoid of the retardation film preferably shows a relationship of nx>ny≥nz. The Nz coefficient of the retardation film is preferably from 1 to 2, more preferably from 1 to 1.5, still more preferably from 1 to 1.3.

The absolute value of the photoelastic coefficient of the first retardation film 20 is preferably $2 \times 10^{-12}$ (m²/N) or more, more preferably from $10 \times 10^{-12}$ (m²/N) to $100 \times 10^{-12}$ (m²/N), still more preferably from $20 \times 10^{-12}$ (m²/N) to $40 \times 10^{-12}$ (m²/N). The absolute value of the photoelastic coefficient of a retardation film showing a reverse wavelength dispersion characteristic is often large, resulting in a prominent color change in the case where a display apparatus is bent with a small radius of curvature. According to the present invention, however, it is possible to provide a circularly polarizing plate in which a color change due to bending can be suppressed even in the case where the display apparatus is bent with a small radius of curvature, while the excellent effect of such retardation film showing a reverse wavelength dispersion characteristic is maintained. In addition, when the absolute value of the photoelastic coefficient falls within the suitable range as described above, the bendability of the display apparatus can be maintained while a sufficient retardation is secured even when the thickness is small. Moreover, a color change due to a stress at the time of bending can be further suppressed.

The first retardation film 20 is formed of any appropriate resin capable of satisfying such optical characteristics as described above. Examples of the resin for forming the retardation film include a polycarbonate resin, a polyvinyl acetal resin, a cycloolefin-based resin, an acrylic resin, and a cellulose ester-based resin. Of those, a polycarbonate resin or a polyvinyl acetal resin is preferred. The resins for forming the first retardation film 20 may be used alone or in combination depending on desired characteristics.

Any appropriate polycarbonate-based resin is used as the polycarbonate-based resin. A preferred example thereof is a polycarbonate resin containing a structural unit derived from a dihydroxy compound. Specific examples of the dihydroxy compound include 9,9-bis(4-hydroxyphenyl)fluorene, 9,9-bis(4-hydroxy-3-methylphenyl) fluorene, 9,9-bis(4-hydroxy-3-ethylphenyl)fluorene, 9,9-bis(4-hydroxy-3-n-propylphenyl) fluorene, 9,9-bis(4-hydroxy-3-isopropylphenyl) fluorene, 9,9-bis(4-hydroxy-3-n-butylphenyl) fluorene, 9,9-bis(4-hydroxy-3-sec-butylphenyl) fluorene, 9,9-bis(4-hydroxy-3-tert-butylphenyl) fluorene, 9,9-bis(4-hydroxy-3-cyclohexylphenyl)fluorene, 9,9-bis(4-hydroxy-3-phenylphenylphenyl)fluorene, 9,9-bis(4-(2-hydroxyethoxy) phenyl) fluorene, 9,9-bis(4-(2-hydroxyethoxy)-3-methylphenyl) fluorene, 9,9-bis(4-(2-hydroxyethoxy)-3-isopropylphenyl) fluorene, 9,9-bis(4-(2-hydroxyethoxy)-3-isobutylphenyl) fluorene, 9,9-bis(4-(2-hydroxyethoxy)-3-tert-butylphenyl) fluorene, 9,9-bis(4-(2-hydroxyethoxy)-3-cyclohexylphenyl) fluorene, 9,9-bis(4-(2-hydroxyethoxy)-3-phenylphenyl) fluorene, 9,9-bis(4-(2-hydroxyethoxy)-3,5-dimethylphenyl) fluorene, 9,9-bis(4-(2-hydroxyethoxy)-3-tert-butyl-6-methylphenyl) fluorene, and 9,9-bis(4-(3-hydroxy-2,2-dimethylpropoxy)phenyl) fluorene. The polycarbonate resin may contain a structural unit derived from the above-mentioned dihydroxy compound as well as a structural unit derived from a dihydroxy compound such as isosorbide, isomannide, isoidide, spiroglycol, dioxaneglycol, or a bisphenol.

The polycarbonate resin as described above is disclosed in, for example, JP 2012-67300 A and JP 3325560 B2 in detail. The disclosures of the patent literatures are incorporated herein by reference.

The glass transition temperature of the polycarbonate resin is preferably 110° C. or more and 250° C. or less, more preferably 120° C. or more and 230° C. or less. When the glass transition temperature is excessively low, the heat resistance of the resin tends to deteriorate and hence the resin may cause a dimensional change after its forming into a film. In addition, the image quality of an organic EL panel to be obtained may reduce. When the glass transition temperature is excessively high, the forming stability of the resin at the time of its forming into a film may deteriorate. In addition, the transparency of the film may be impaired. It should be noted that the glass transition temperature is determined in conformity with JIS K 7121 (1987).

Any appropriate polyvinyl acetal resin may be used as the polyvinyl acetal resin. The polyvinyl acetal resin can be typically obtained by subjecting at least two kinds of aldehyde compounds and/or ketone compounds, and a polyvinyl alcohol-based resin to a condensation reaction. Specific examples of the polyvinyl acetal resin and a detailed production method therefor are disclosed in, for example, JP 2007-161994 A. The disclosure is incorporated herein by reference.

The first retardation film 20 is typically produced by stretching a resin film in at least one direction.

Any appropriate method may be adopted as a method of forming the resin film. Examples thereof include a melt extrusion method (such as a T die method), a cast coating method (such as a casting method), a calender method, a hot press method, a co-extrusion method, a co-melting method, multilayer extrusion, and an inflation method. Of those, a T die method, a casting method, and an inflation method are preferably used.

The thickness of the resin film (unstretched film) may be set to any appropriate value depending on, for example, desired optical characteristics and stretching conditions to be described later. The thickness is preferably from 50 μm to 300 μm, more preferably from 80 μm to 250 μm.

Any appropriate stretching method and stretching conditions (such as a stretching temperature, a stretching ratio, and a stretching direction) may be adopted for the stretching. Specifically, one kind of various stretching methods such as free-end stretching, fixed-end stretching, free-end shrinkage, and fixed-end shrinkage may be employed alone, or two or more kinds thereof may be employed simultaneously or sequentially. With regard to the stretching direction, the stretching may be performed in various directions or dimensions such as a transverse direction, an elongate direction, a thickness direction, and a diagonal direction. When the glass transition temperature of the resin film is represented by Tg, the stretching temperature falls within a range of Tg±20° C.

A retardation film having the desired optical characteristics (such as a refractive index ellipsoid, an in-plane retardation, and an Nz coefficient) can be obtained by appropriately selecting the stretching method and stretching conditions.

In one embodiment, the first retardation film 20 is produced by subjecting the resin film to uniaxial stretching or fixed-end uniaxial stretching. A specific example of the uniaxial stretching is a method involving stretching the resin film in its longitudinal direction (elongate direction) while running the film in its elongate direction. Another specific example of the uniaxial stretching is a method involving stretching the resin film in its transverse direction with a tenter. The stretching ratio is preferably from 10% to 500%.

In another embodiment, the retardation film is produced by obliquely stretching a resin film having an elongate shape in a direction at the angle θ with respect to its elongate direction in a continuous manner. Adopting the oblique stretching provides a stretched film having an elongate shape with an alignment angle of the angle θ with respect to the elongate direction of the film, enables a roll-to-roll process upon, for example, its lamination with the polarizer, and can simplify a production process.

A stretching machine to be used in the oblique stretching is, for example, a tenter-type stretching machine capable of applying a feeding force or tensile force, or take-up force having different speeds on left and right sides in a transverse direction and/or a elongate direction. Although the tenter-type stretching machine comes in, for example, a transverse uniaxial stretching machine and a simultaneous biaxial stretching machine, any appropriate stretching machine may be used as long as the machine can obliquely stretch the resin film having an elongate shape in a continuous manner.

As a method for the oblique stretching, there are given, for example, methods disclosed in JP 50-83482 A, JP 02-113920 A, JP 03-182701 A, JP 2000-9912 A, JP 2002-86554 A, JP 2002-22944 A, and the like.

The first retardation film (stretched film) has a thickness of preferably from 20 μm to 100 μm, more preferably from 30 μm to 80 μm.

As the first retardation film 20, a commercially available film may be used as it is, or a commercially available film may be subjected to secondary processing (such as stretching treatment or surface treatment) before use depending on purposes. A specific example of the commercially available film is a product available under the trade name "PURE-ACE WR" from Teijin Limited.

The surface of the first retardation film 20 on the polarizer 10 side may be subjected to surface treatment. Examples of the surface treatment include corona treatment, plasma treatment, flame treatment, primer application treatment, and saponification treatment. The corona treatment is, for example, a system involving performing discharge with a corona treatment machine in normal-pressure air. The plasma treatment is, for example, a system involving performing discharge with a plasma discharger in normal-pressure air. The flame treatment is, for example, a system involving bringing a flame into direct contact with the surface of the film. The primer application treatment is, for example, a system involving: diluting an isocyanate compound, a silane coupling agent, and the like with a solvent; and applying the diluted liquid in a thin manner. The saponification treatment is, for example, a system involving immersing the film in an aqueous solution of sodium hydroxide. Of those, the corona treatment or the plasma treatment is preferred.

A-3. Second Retardation Film

As described above, the second retardation film 30 is arranged on the surface of the polarizer 10 opposite to the first retardation film 20 (that is, on the surface on the outer side (viewer side) of the circularly polarizing plate). In one embodiment, the second retardation film 30 has a function of converting linearly polarized light, which is output from the polarizer toward the viewer side, into elliptically polarized light or circularly polarized light. That is, in this embodiment, the second retardation film 30 may function as a so-called λ/4 plate. The second retardation film 30 is arranged so that its slow axis may form an angle with the absorption axis of the polarizer 10 of preferably from 30° to 60°, more preferably from 40° to 50°, still more preferably around 45°. When such second retardation film 30 is arranged closer to the viewer side than the polarizer 10 is while satisfying the axis relationship as described above, excellent viewability can be realized even in the case where a display screen is viewed through a polarized lens such as polarized sunglasses. Therefore, the circularly polarizing plate of the present invention can be suitably applied even to a display apparatus that may be used outdoors. In this embodiment, any appropriate retardation film that may function as a Δ/4 plate may be used as the second retardation film 30. For example, the in-plane retardation Re(550) of the second retardation film 30 is preferably from 100 nm to 180 nm, more preferably from 135 nm to 155 nm. Other optical characteristics, mechanical characteristics, a constituent material, a manufacturing method, and the like may be appropriately set or selected depending on purposes. For example, the second retardation film 30 may be a film described in the section A-2, may be a film using any other polymer (e.g., a cycloolefin-based resin), or may be a film obtained by applying a liquid crystal material.

In another embodiment, the second retardation film 30 may be, for example, an ultra-high-retardation film having an in-plane retardation Re(550) of 3,000 nm or more. The use of such film can prevent the viewability from being affected by a wavelength-dependent shift in polarization state. Therefore, as in the foregoing, excellent viewability can be realized even in the case where a display screen is viewed through a polarized lens such as polarized sunglasses. In this embodiment, the second retardation film 30 may be, for example, a stretched film of polyethylene terephthalate (PET).

A-4. Protective Film

The protective film 40 is formed of any appropriate film that may be used as a protective layer for the polarizer. Specific examples of a material serving as a main component of the film include transparent resins such as a cellulose-based resin such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth)acrylic resin, and an acetate-based resin. Another example thereof is a thermosetting resin or a UV-curable resin such as a (meth)acrylic resin, a urethane-based resin, a (meth)acrylic urethane-based resin, an epoxy-based resin, or a silicone-based resin. Still another example thereof is a glassy polymer such as a siloxane-based polymer. Further, a polymer film described in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in a side chain. An example thereof is a resin composition containing an alternate copolymer formed of isobutene and N-methylmaleimide and an acrylonitrile-styrene copolymer. The polymer film may be an extruded product of the resin composition, for example.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, and is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl (meth)acrylate-styrene copolymer (such as an MS resin), and a polymer having an alicyclic hydrocarbon group (such as a methyl metharylate-cyclohexyl methacrylate copolymer or a methyl methacrylate-norbornyl (meth)acrylate copolymer). Preferred examples thereof include poly ($C_{1-6}$ alkyl (meth)acrylates) such as polymethyl (meth)acrylate. A more preferred example thereof is a methyl methacrylate-based resin containing methyl methacrylate as a main component (from 50 to 100 wt %, preferably from 70 to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth)acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, and is preferably 170° C. or less from the viewpoint of formability or the like.

It should be noted that the term "(meth)acrylic" as used herein refers to acrylic and/or methacrylic.

The thickness of the protective film 40 is preferably from 10 μm to 200 μm, more preferably from 10 μm to 100 μm, still more preferably from 15 μm to 95 μm. The protective film 40 has in-plane retardation Re(550) of, for example, from 0 nm to 10 nm, and thickness direction retardation Rth (550) of, for example, from −80 nm to +80 nm.

The surface of the protective film 40 on a side opposite to the polarizer may be subjected to surface treatment such as hard coat treatment, antireflection treatment, antisticking treatment, or antiglare treatment as required. The thickness of the protective film is typically 5 mm or less, preferably 1 mm or less, more preferably from 1 μm to 500 μm, still more preferably from 5 μm to 150 μm.

When the inner protective film (not shown) is provided, the inner protective film is preferably optically isotropic. The phrase "optically isotropic" as used herein means that the in-plane retardation Re(550) is from 0 nm to 10 nm, and the thickness direction retardation Rth(550) is from −10 nm to +10 nm.

The thickness of the inner protective film is preferably from 20 μm to 200 μm, more preferably from 30 μm to 100 μm, still more preferably from 35 μm to 95 μm.

A-5. Easy-Adhesion Layer

In one embodiment, the surface of the first retardation film 20 on the polarizer 10 side may be provided with an easy-adhesion layer (not shown). When the easy-adhesion layer is provided, the first retardation film 20 may be subjected to the above-described surface treatment or may not be subjected thereto. The first retardation film 20 is preferably subjected to the surface treatment. The combination of the easy-adhesion layer and the surface treatment can accelerate the realization of a desired adhesive strength between the polarizer 10 and the first retardation film 20. The easy-adhesion layer preferably contains a silane having a reactive functional group. Providing such easy-adhesion layer can accelerate the realization of the desired adhesive strength between the polarizer 10 and the first retardation film 20. Details about the easy-adhesion layer are disclosed in, for example, JP 2006-171707 A.

A-6. Others

Any appropriate pressure-sensitive adhesive layer or adhesive layer is used in the lamination of the respective layers constituting the circularly polarizing plate of the present invention. The pressure-sensitive adhesive layer is typically formed of an acrylic pressure-sensitive adhesive. The adhesive layer is typically formed of a polyvinyl alcohol-based adhesive.

Although not shown, a pressure-sensitive adhesive layer may be formed on the circularly polarizing plate on the first retardation film 20 side. When the pressure-sensitive adhesive layer is formed in advance, the polarizing plate can be easily bonded to any other optical member (such as an organic EL display apparatus). It should be noted that a release film is preferably attached to the surface of the pressure-sensitive adhesive layer until the layer is used.

B. Display Apparatus

Figure 3:
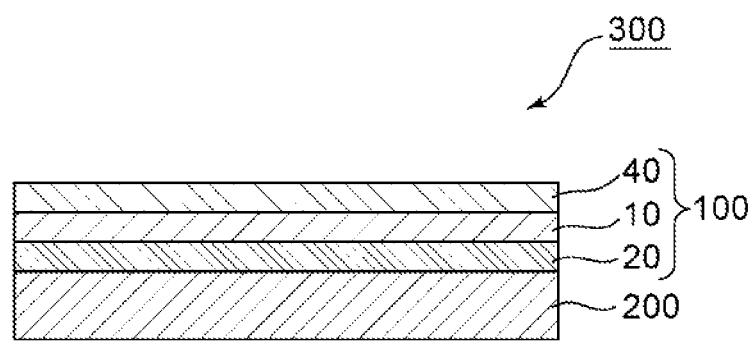
FIG. 3 is a schematic sectional view of an organic EL display apparatus according to one embodiment of the present invention.

A display apparatus of the present invention includes the circularly polarizing plate described above. In one embodiment, the display apparatus of the present invention is an organic EL display apparatus. FIG. 3 is a schematic sectional view of an organic EL display apparatus according to one embodiment of the present invention. An organic EL display apparatus 300 includes an organic EL device 200 and the circularly polarizing plate 100 on the viewer side of the organic EL device 200. The circularly polarizing plate is the circularly polarizing plate of the present invention described in the section A. The circularly polarizing plate is laminated so that the first retardation film 20 may be on the organic EL device side (so that the polarizer 10 may be on the viewer side). It should be noted that the circularly polarizing plate is not limited to the mode illustrated in FIG. 3, and may be the circularly polarizing plate 100' as illustrated in FIG. 1(*b*), or may be a circularly polarizing plate according to still another embodiment of the present invention (not shown).

In the present invention, as described above, in the circularly polarizing plate, the slow axis direction of the first retardation film 20 is adjusted so as to form the angle α with respect to the bending direction of the organic EL display apparatus 300 (or the organic EL device 200). The angle α is from 20° to 70°, preferably from 30° to 60°, more preferably from 40° to 50°, particularly preferably around 45°. When the circularly polarizing plate 100 and the organic EL device 200 are laminated so that the angle α may fall within such range, there can be obtained a bendable display apparatus in which a color change due to bending is suppressed. In one embodiment, the bending direction of the organic EL display apparatus 300 (or the organic EL device 200) is a longitudinal direction or a direction perpendicular to the longitudinal direction (transverse direction). In such embodiment, when the absorption axis of the polarizer 10 of the circularly polarizing plate is set perpendicular or parallel to the longitudinal direction (or the transverse direction), in the lamination of the circularly polarizing plate on the organic EL device, the position of the slow axis of the first retardation film 20 does not need to be adjusted, and only the position of the absorption axis direction of the polarizer 10 needs to be adjusted. In this manner, the organic EL display apparatus can be manufactured by a roll-to-roll process.

B-1. Organic EL Device

Figure 4:
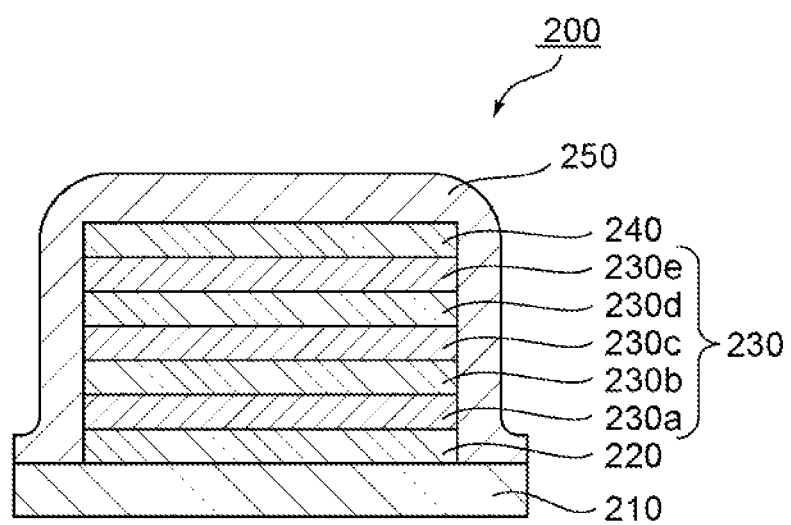
FIG. 4 is a schematic sectional view of an organic EL device to be used in an organic EL display apparatus according to one embodiment of the present invention.

Any appropriate organic EL device may be adopted as the organic EL device 200 as long as the effects of the present invention are obtained. FIG. 4 is a schematic sectional view for illustrating one mode of the organic EL device to be used in the present invention. The organic EL device 200 typically includes a substrate 210, a first electrode 220, an organic EL layer 230, a second electrode 240, and a sealing layer 250 for covering these components. The organic EL device 200 may further include any appropriate layer as required. For example, a planarizing layer (not shown) may be provided on the substrate, or an insulating layer (not shown) for preventing a short circuit may be provided between the first electrode and the second electrode.

The substrate 210 may be formed of any appropriate material as long as the substrate 210 is bendable with the above-mentioned predetermined radius of curvature. The substrate 210 is typically formed of a material having flexibility. The use of the substrate having flexibility enables the following in addition to the above-mentioned effect of the present invention: when a circularly polarizing plate having an elongate shape is used, the organic EL display apparatus can be manufactured by the so-called roll-to-roll process, and hence can be mass-produced at low cost. Further, the substrate 210 is preferably formed of a material having a barrier property. Such substrate can protect the organic EL layer 230 from oxygen or moisture. Specific examples of the material having a barrier property and flexibility include thin glass provided with flexibility, a film of a thermoplastic resin or thermosetting resin provided with a barrier property, an alloy, and a metal. Examples of the thermoplastic resin or the thermosetting resin include a polyester-based resin, a polyimide-based resin, an epoxy-based resin, a polyurethane-based resin, a polystyrene-based resin, a polyolefin-based resin, a polyamide-based resin, a polycarbonate-based resin, a silicone-based resin, a fluorine-based resin, and an acrylonitrile-butadiene-styrene copolymer resin. Examples of the alloy include stainless steel, alloy 36, and alloy 42. Examples of the metal include copper, nickel, iron, aluminum, and titanium. The thickness of the substrate is preferably from 5 μm to 500 μm, more preferably from 5 μm to 300 μm, still more preferably from 10 μm to 200 μm. With such thickness, the organic EL display apparatus can be made bendable with the above-mentioned predetermined radius of curvature, and an excellent balance is obtained among flexibility, handleability, and mechanical strength. In addition, the organic EL device can be suitably used in the roll-to-roll process.

The first electrode 220 can typically function as an anode. In this case, a material constituting the first electrode is preferably a material having a large work function from the viewpoint of facilitating the injection of a hole. Specific examples of such material include: transparent conductive materials such as indium tin oxide (ITO), indium zinc oxide (IZO), indium tin oxide doped with silicon oxide (ITSO), indium oxide containing tungsten oxide (IWO), indium zinc oxide containing tungsten oxide (IWZO), indium oxide containing titanium oxide (ITio), indium tin oxide containing titanium oxide (ITTiO), and indium tin oxide containing molybdenum (ITMO); and metals such as gold, silver, and platinum, and alloys thereof.

The organic EL layer 230 is a laminate including various organic thin films. In the illustrated example, the organic EL layer 230 includes: a hole-injecting layer 230a formed of a hole injectable organic material (such as a triphenylamine derivative), and formed so as to improve the hole injection efficiency from an anode; a hole-transporting layer 230b formed of, for example, copper phthalocyanine; a light-emitting layer 230c formed of a luminous organic substance (such as anthracene, bis[N-(1-naphthyl)-N-phenyl]benzidine, or N,N'-diphenyl-N—N-bis(1-naphthyl)-1,1'-(biphenyl)-4,4'-diamine (NPB)); an electron-transporting layer 230d formed of, for example, an 8-quinolinol aluminum complex; and an electron-injecting layer 230e formed of an electron injectable material (such as a perylene derivative or lithium fluoride), and formed so as to improve the electron injection efficiency from a cathode. The organic EL layer 230 is not limited to the illustrated example, and any appropriate combination that can cause light emission through the recombination of an electron and a hole in the light-emitting layer 230c may be adopted. The thickness of the organic EL layer 230 is preferably as small as possible. This is because the layer preferably transmits the emitted light to the extent possible. The organic EL layer 230 can be constituted of an extremely thin laminate having a thickness of, for example, from 5 nm to 200 nm, preferably about 10 nm.

The second electrode 240 can typically function as a cathode. In this case, a material constituting the second electrode is preferably a material having a small work function from the viewpoint of facilitating the injection of an electron to improve luminous efficiency. Specific examples of such material include aluminum, magnesium, and alloys thereof.

The sealing layer 250 is constituted of any appropriate material. The sealing layer 250 is preferably constituted of a material excellent in barrier property and transparency. Typical examples of the material constituting the sealing layer include an epoxy resin and polyurea. In one embodiment, the sealing layer 250 may be formed by applying the epoxy resin (typically an epoxy resin adhesive) and bonding a barrier sheet onto the resin.

It is preferred that the organic EL device 200 may be continuously manufactured by the roll-to-roll process. The organic EL device 200 may be manufactured by, for example, a procedure in accordance with the procedure disclosed in JP 2012-169236 A, the disclosure of which is incorporated herein by reference. Further, the organic EL device 200 may be continuously laminated with the circularly polarizing plate 100 that has an elongate shape by the roll-to-roll process, to thereby continuously manufacture the organic EL display apparatus 300.

It should be noted that the bendable organic EL display apparatus is disclosed in, for example, JP 4601463 B2 and JP 4707996 B2 in detail. The disclosures of the patent literatures are incorporated herein by reference.

EXAMPLES

Now, the present invention is specifically described by way of Examples. However, the present invention is not limited by Examples below.

Example 1

(Production of Polarizer)

A polyvinyl alcohol film having an elongate shape was dyed in an aqueous solution containing iodine. After that, the film was uniaxially stretched at a stretching ratio of 6 times in an aqueous solution containing boric acid between rolls having different speed ratios to provide a polarizer having an elongate shape and having an absorption axis in its longitudinal direction. After the stretching, the polarizer having an elongate shape was rolled into a roll body.

(Protective Film)

A triacetylcellulose film having an elongate shape (thickness: 40 µm, manufactured by Konica Minolta, Inc., trade name: KC4UYW) was used as a protective film. The protective film was prepared as a roll body. It should be noted that the protective film had an in-plane retardation Re(550) of 5 nm and a thickness direction retardation Rth(550) of 45 nm.

(Retardation Film)

A commercially available retardation film showing reverse wavelength dispersion dependency (manufactured by Teijin Limited, trade name "PURE-ACE WR") was used. The retardation film had an in-plane retardation Re(550) of 147 nm, a ratio Re(450)/Re(550) of 0.89, and a photoelastic coefficient of $65 \times 10^{-12}$ Pa$^{-1}$ (m$^2$/N).

(Production of Circularly Polarizing Plate)

The polarizer, the protective film, and the retardation film were each cut into a piece measuring 200 mm by 300 mm. The polarizer and the protective film were bonded to each other through a polyvinyl alcohol-based adhesive. Further, the laminate of the polarizer and the protective film, and the retardation film were bonded to each other through an acrylic pressure-sensitive adhesive layer so that the polarizer and the retardation film were adjacent to each other. Thus, a circularly polarizing plate having a construction "protective film/polarizer/retardation film (first retardation film)" was produced. After that, the produced circularly polarizing plate was trimmed into a size of 50 mm×80 mm. It should be noted that the retardation film was cut so that its slow axis and the absorption axis of the polarizer formed an angle of 45° upon its bonding. In addition, the absorption axis of the polarizer was arranged so as to be parallel to the longitudinal direction.

(Production of Organic EL Display Apparatus Substitute)

A substitute for a bendable organic EL display apparatus was produced as follows. First, five kinds of acrylic blocks each having a size of 40 mm×120 mm×20 mm in thickness, and differing from each other in radius of curvature at each of both end portions in the longitudinal direction were prepared. The radii of curvature of the respective acrylic blocks were 2 mm, 3.5 mm, 5 mm, 8 mm, and 15 mm. Next, an aluminum metallized film (manufactured by Toray Advanced Film Co., Ltd., trade name: "DMS Metallized X-42", thickness: 50 µm) was bonded onto each of the acrylic blocks with a pressure-sensitive adhesive, and the resultant was used as a substitute for a bendable organic EL display apparatus.

The circularly polarizing plate obtained in the foregoing was wrapped onto the organic EL display apparatus substitute with their longitudinal directions aligned, and an end portion was fixed with a tape so as to prevent separation between the circularly polarizing plate and the organic EL display apparatus substitute at the bent portion. As a result, the slow axis of the retardation film (first retardation film) formed an angle of 45° with respect to the longitudinal direction and transverse direction of the organic EL display apparatus substitute. That is, the slow axis of the retardation film (first retardation film) was caused to form an angle of 45° with respect to the bending direction. Thus, a sample for evaluation was obtained. The obtained sample for evaluation was subjected to measurement of a retardation distribution and retardation change at the bent portion in the below-indicated manner. The results are shown in Table 1.

(1) Retardation Distribution and Retardation Change

The sample for evaluation was kept in an environment having a temperature of 25° C. and a humidity of 50% for 24 hours, and then the circularly polarizing plate was removed. The removed circularly polarizing plate was measured for its retardation at a portion that had been bent and its retardation at a portion that had been flat with an Axoscan manufactured by Axometrics, Inc. Then, retardation values were estimated through simulation on the basis of the results of the measurement using multi-layer analysis software included with the Axoscan. A difference between the retardation of the circularly polarizing plate at the portion that had been bent and its retardation at the portion that had been flat was defined as a retardation change. In addition, the removed circularly polarizing plate was visually observed, and evaluation was performed by marking a case where a color change was small with Symbol "○", and marking a case where a color change was large with Symbol "x". Further, a retardation distribution was measured on an XY translation stage using a method similar to that described above.

(2) Photoelastic Coefficient

Retardation films used in Examples and Comparative Examples were each cut into a size of 20 mm×100 mm to produce a sample. The sample was subjected to measurement through the use of an ell ipsometer (manufactured by JASCO Corporation, M-150) with light having a wavelength of 550 nm. Thus, aphotoelastic coefficient was obtained.

Example 2

A sample for evaluation was obtained in the same manner as in Example 1 except that the below-indicated retardation film was used as a retardation film showing reverse dispersion-type wavelength dependence in place of the "PURE-ACE WR". The sample for evaluation was subjected to the same evaluations as those of Example 1. The results are shown in Table 1.

A resin was prepared in accordance with Example 2 of JP 4938151 B2, and the resin was formed into a film, followed by free-end uniaxial stretching at a temperature of 150° C. (stretching ratio: 2 times). Thus, a retardation film showing reverse dispersion-type wavelength dependence was obtained. The retardation film had an in-plane retardation Re(550) of 145 nm, a ratio Re(450)/Re(550) of 0.89, and a photoelastic coefficient of $39 \times 10^{-12}$ $Pa^{-1}$ ($m^2/N$).

Comparative Example 1

A circularly polarizing plate having a size of 50 mm×80 mm was produced in the same manner as in Example 1. The circularly polarizing plate was wrapped onto the organic EL display apparatus substitute, and an end portion was fixed with a tape so as to prevent separation between the circularly polarizing plate and the organic EL display apparatus substitute at the bent portion, in the same manner as in Example 1. In this case, the circularly polarizing plate and the organic EL display apparatus substitute were laminated so that the slow axis of the retardation film (first retardation film) was parallel to the transverse direction of the organic EL display apparatus substitute. That is, the slow axis of the retardation film (first retardation film) was caused to be parallel to the bending direction. Thus, a sample for evaluation was obtained. The obtained sample for evaluation was subjected to the same evaluations as those of Example 1. The results are shown in Table 1.

Comparative Example 2

A sample for evaluation was obtained in the same manner as in Comparative Example 1 except that the slow axis of the retardation film (first retardation film) was caused to be perpendicular to the bending direction. The obtained sample for evaluation was subjected to the same evaluations as those of Example 1. The results are shown in Table 1.

Comparative Example 3

A sample for evaluation was obtained in the same manner as in Comparative Example 1 except that the circularly polarizing plate of Example 2 was used. The obtained sample for evaluation was subjected to the same evaluations as those of Example 1. The results are shown in Table 1.

Comparative Example 4

A sample for evaluation was obtained in the same manner as in Comparative Example 2 except that the circularly polarizing plate of Example 2 was used. The obtained sample for evaluation was subjected to the same evaluations as those of Example 1. The results are shown in Table 1.

Example 3

A sample for evaluation was obtained in the same manner as in Example 1 except that the slow axis of the retardation film (first retardation film) was caused to form an angle of 30° with respect to the bending direction. The obtained sample for evaluation was subjected to the same evaluations as those of Example 1. The results are shown in Table 1.

Example 4

A sample for evaluation was obtained in the same manner as in Example 2 except that the slow axis of the retardation film (first retardation film) was caused to form an angle of 30° with respect to the bending direction. The obtained sample for evaluation was subjected to the same evaluations as those of Example 1. The results are shown in Table 1.

Example 5

A sample for evaluation was obtained in the same manner as in Example 1 except that the slow axis of the retardation film (first retardation film) was caused to form an angle of 60° with respect to the bending direction. The obtained sample for evaluation was subjected to the same evaluations as those of Example 1. The results are shown in Table 1.

Example 6

A sample for evaluation was obtained in the same manner as in Example 2 except that the slow axis of the retardation film (first retardation film) was caused to form an angle of 60° with respect to the bending direction. The obtained sample for evaluation was subjected to the same evaluations as those of Example 1. The results are shown in Table 1.

Comparative Example 5

A sample for evaluation was obtained in the same manner as in Example 1 except that the slow axis of the retardation film (first retardation film) was caused to form an angle of 15° with respect to the bending direction. The obtained sample for evaluation was subjected to the same evaluations as those of Example 1. The results are shown in Table 1.

Comparative Example 6

A sample for evaluation was obtained in the same manner as in Example 2 except that the slow axis of the retardation film (first retardation film) was caused to form an angle of 15° with respect to the bending direction. The obtained sample for evaluation was subjected to the same evaluations as those of Example 1. The results are shown in Table 1.

Comparative Example 7

A sample for evaluation was obtained in the same manner as in Example 1 except that the slow axis of the retardation film (first retardation film) was caused to form an angle of 75° with respect to the bending direction. The obtained sample for evaluation was subjected to the same evaluations as those of Example 1. The results are shown in Table 1.

Comparative Example 8

A sample for evaluation was obtained in the same manner as in Example 2 except that the slow axis of the retardation film (first retardation film) was caused to form an angle of 75° with respect to the bending direction. The obtained sample for evaluation was subjected to the same evaluations as those of Example 1. The results are shown in Table 1.

TABLE 1

| | Photoelastic Coefficient | Angle | Radii of curvature (mm) | | | | |
|---|---|---|---|---|---|---|---|
| | ($10^{-12}$ $Pa^{-1}$) | (°) | 2 | 3.5 | 5 | 8 | 15 |
| Example 1 | 65 | 45 | x | x | o | o | o |
| | | | 4 | 3 | 2 | 2 | 1 |
| Example 2 | 39 | 45 | o | o | o | o | o |
| | | | 2 | 2 | 1 | 1 | 1 |
| Comparative Example 1 | 65 | 0 | x | x | x | x | x |
| | | | 12 | 9 | 6 | 4 | 4 |
| Comparative Example 2 | 65 | 90 | x | x | x | x | x |
| | | | 14 | 8 | 6 | 5 | 4 |
| Comparative Example 3 | 39 | 0 | x | x | x | o | o |
| | | | 5 | 4 | 3 | 2 | 0 |
| Comparative Example 4 | 39 | 90 | x | x | x | o | o |
| | | | 6 | 5 | 3 | 2 | 1 |
| Example 3 | 65 | 30 | x | x | o | o | o |
| | | | 5 | 4 | 2 | 2 | 2 |
| Example 4 | 39 | 30 | x | o | o | o | o |
| | | | 3 | 2 | 2 | 2 | 1 |
| Example 5 | 65 | 60 | x | x | o | o | o |
| | | | 5 | 4 | 2 | 2 | 2 |
| Example 6 | 39 | 60 | x | o | o | o | o |
| | | | 4 | 2 | 2 | 2 | 1 |
| Comparative Example 5 | 65 | 15 | x | x | x | x | o |
| | | | 8 | 6 | 4 | 3 | 2 |
| Comparative Example 6 | 39 | 15 | x | x | x | o | o |
| | | | 5 | 3 | 3 | 2 | 1 |
| Comparative Example 7 | 65 | 75 | x | x | x | x | o |
| | | | 9 | 5 | 5 | 3 | 2 |
| Comparative Example 8 | 39 | 75 | x | x | x | o | o |
| | | | 5 | 3 | 3 | 2 | 1 |

*Upper part: visual observation; lower part: retardation change (mm)

[Evaluation]

As is apparent from Table 1, according to each of Examples of the present invention, satisfactory results can be obtained at a smaller radius of curvature in terms of both color change at the bent portion and retardation change at the bent portion.

INDUSTRIAL APPLICABILITY

The circularly polarizing plate of the present invention is suitably used in a bendable display apparatus, and particularly suitably used in an organic EL display apparatus.

10 polarizer
20 retardation film (first retardation film)
30 second retardation film
40 protective film
100 circularly polarizing plate
100' circularly polarizing plate
200 organic EL device
300 organic EL display apparatus

The invention claimed is:

1. A circularly polarizing plate to be used in a bendable display apparatus, comprising:
   a polarizer; and
   a retardation film arranged on one side of the polarizer, the retardation film being formed of a single resin film,
   wherein in-plane retardations at 450 nm, 550 nm, and 650 nm of the retardation film satisfy a relationship of Re(450)<Re(550)<Re(650),
   wherein a ratio of Re(450) to Re(550) is 0.8 or more and less than 1.0,
   wherein a ratio of Re(550) to Re(650) is 0.8 or more and less than 1.0,
   wherein a slow axis direction of the retardation film is adjusted so as to form an angle of from 20° to 70° with respect to a bending direction of the display apparatus,
   wherein the retardation film is a stretched film, and
   wherein the display apparatus is an organic electroluminescence display apparatus.

2. The circularly polarizing plate according to claim 1, wherein at least part of the display apparatus is bent with a radius of curvature of 10 mm or less.

3. The circularly polarizing plate according to claim 1, wherein an absolute value of a photoelastic coefficient of the retardation film is $2\times10^{-12}$ ($m^2$/N) or more.

4. The circularly polarizing plate according to claim 1, further comprising another retardation film arranged on another side of the polarizer.

5. A bendable display apparatus, comprising the circularly polarizing plate of claim 1.

6. The circularly polarizing plate according to claim 1, wherein the single resin film is composed of at least one resin selected from the group consisting of a polycarbonate resin, a polyvinyl acetal resin, a cycloolefin-based resin, an acrylic resin, and a cellulose ester-based resin.

7. The circularly polarizing plate according to claim 1, wherein the retardation film has a thickness of from 20 μm to 100 μm.

* * * * *